(12) United States Patent
Lee

(10) Patent No.: US 10,490,585 B1
(45) Date of Patent: Nov. 26, 2019

(54) IMAGING PIXELS WITH PLASMONIC COLOR FILTER ELEMENTS

(71) Applicant: SEMICONDUCTOR COMPONENTS INDUSTRIES, LLC, Phoenix, AZ (US)

(72) Inventor: Byounghee Lee, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/979,190

(22) Filed: May 14, 2018

(51) Int. Cl.
| | |
|---|---|
| *G01J 1/16* | (2006.01) |
| *H01L 31/0232* | (2014.01) |
| *H04N 5/374* | (2011.01) |
| *H01L 27/146* | (2006.01) |
| *H04N 5/335* | (2011.01) |
| *H01L 31/0216* | (2014.01) |
| *G01J 1/04* | (2006.01) |
| *G01J 3/28* | (2006.01) |
| *G06K 9/20* | (2006.01) |
| *G06F 3/03* | (2006.01) |

(52) U.S. Cl.
CPC .. *H01L 27/14621* (2013.01); *H01L 27/14627* (2013.01); *H01L 31/02162* (2013.01); *H04N 5/335* (2013.01); *G01J 1/0488* (2013.01); *G01J 3/2803* (2013.01); *G01J 2003/2806* (2013.01); *G06F 3/0304* (2013.01); *G06K 9/2009* (2013.01); *H01L 27/146* (2013.01); *H01L 27/14603* (2013.01); *H01L 27/14625* (2013.01); *H01L 27/14665* (2013.01); *H04N 5/374* (2013.01)

(58) Field of Classification Search
CPC ......... H01L 27/14521; H01L 27/14627; H01L 31/02162; H01L 27/14603; H01L 27/14625; H01L 27/146; H01L 27/14665; H04N 5/335; H04N 5/374; G06F 3/0304; G06K 9/2009; G01J 2003/2806; G01J 3/2803
USPC .................... 257/E31.11, E31.127, 294, 432
See application file for complete search history.

(56) References Cited

U.S. PATENT DOCUMENTS

| | | | | |
|---|---|---|---|---|
| 8,866,950 | B2* | 10/2014 | Yokogawa | ........ H01L 27/14621 348/340 |
| 2006/0049412 | A1* | 3/2006 | Cho | .................. H01L 27/14627 257/80 |
| 2006/0145219 | A1* | 7/2006 | Lim | .................. H01L 27/14623 257/294 |

(Continued)

*Primary Examiner* — Ly D Pham
(74) *Attorney, Agent, or Firm* — Treyz Law Group, P.C.; Joseph F. Guihan

(57) ABSTRACT

Image sensors may include plasmonic color filter elements that transmit specific wavelengths of incident light. Each plasmonic color filter element may be interposed between a respective microlens and photosensitive area. The plasmonic color filter elements may be formed from a metal layer such as gold, silver, platinum, aluminum, or copper and may have a pattern of openings in the metal layer that is designed to allow transmission of a certain type of light. To prevent cross-talk between adjacent pixels having plasmonic color filter elements, metal walls may be interposed between adjacent plasmonic color filter elements. The metal walls may extend above the upper surface of the metal layer that forms the plasmonic color filter elements. The metal walls may run around the periphery of each plasmonic color filter element.

18 Claims, 6 Drawing Sheets

(56) References Cited

U.S. PATENT DOCUMENTS

| | | | |
|---|---|---|---|
| 2009/0073434 A1 | 3/2009 | Kim et al. | |
| 2012/0086091 A1* | 4/2012 | Crocherie | H01L 27/14621 257/432 |
| 2012/0104478 A1* | 5/2012 | Masuoka | H01L 27/14629 257/292 |
| 2012/0326015 A1* | 12/2012 | Salsman | G02B 5/008 250/227.11 |
| 2012/0326256 A1* | 12/2012 | Salsman | H01L 27/14603 257/432 |
| 2013/0293749 A1* | 11/2013 | Vaartstra | H04N 9/045 348/273 |
| 2014/0191113 A1* | 7/2014 | Atwater | H01L 27/14621 250/208.1 |
| 2016/0142654 A1 | 5/2016 | Vaillancourt | |
| 2016/0254303 A1* | 9/2016 | Takimoto | G02B 5/20 257/432 |
| 2017/0013215 A1* | 1/2017 | McCarten | H04N 5/361 |
| 2017/0208284 A1* | 7/2017 | Parks | H01L 27/14812 |

\* cited by examiner

IMAGING PIXELS WITH PLASMONIC COLOR FILTER ELEMENTS

BACKGROUND

This relates generally to imaging devices, and more particularly, to imaging devices having color filter elements.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Conventional imaging pixels are covered by color filter elements formed from organic material. The color filter elements filter incident light to allow only light of a desired wavelength to reach the underlying pixel. However, the color filter elements of conventional imaging pixels may require different materials to transmit different colors of incident light and may have wider than desired transmission profiles.

It would therefore be desirable to be able to provide improved arrangements for color filter elements in image sensors.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
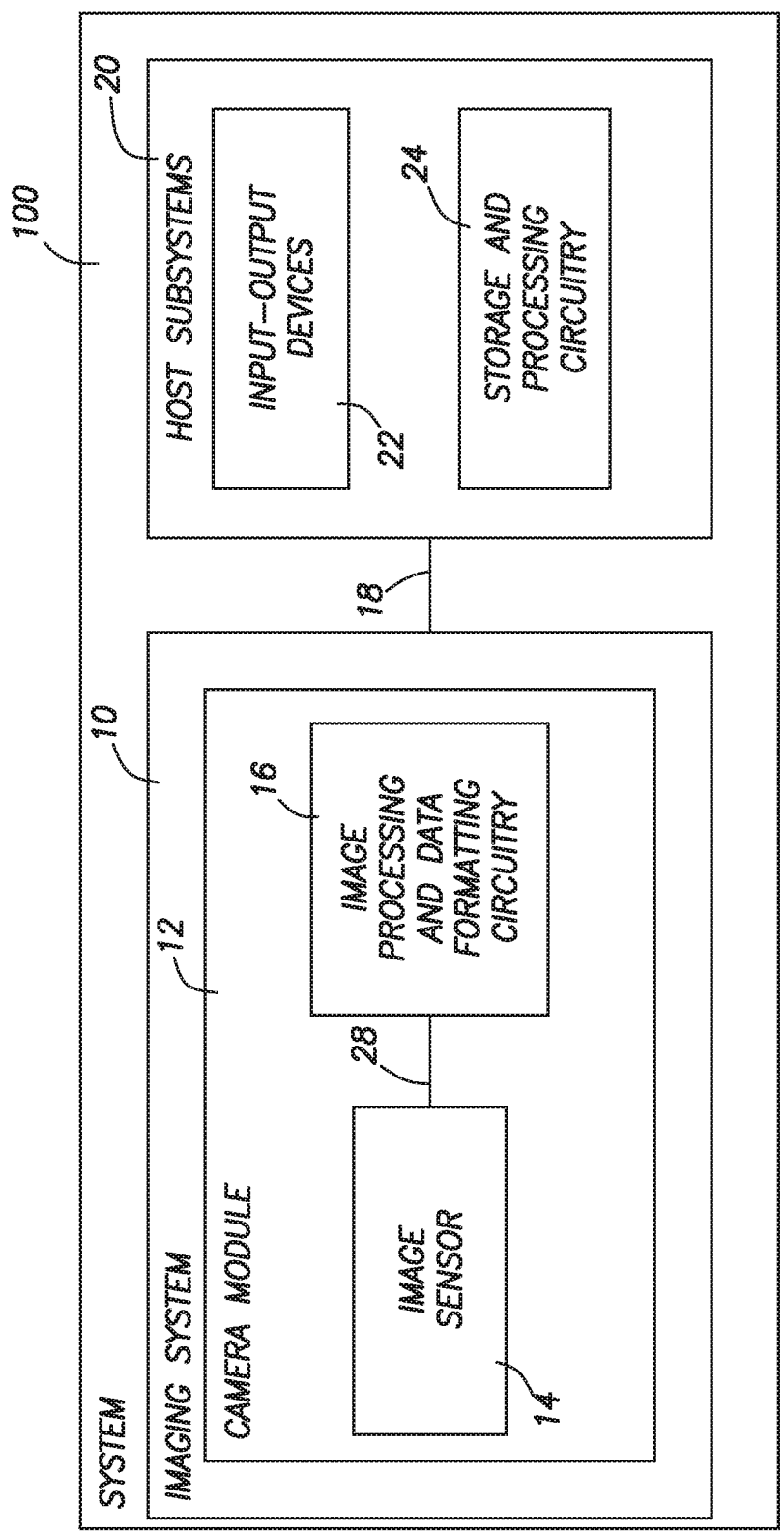
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

System 100 may be a vehicle safety system. In a vehicle safety system, images captured by the image sensor may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), a pedestrian detection system, etc. In at least some instances, an image sensor may form part of a semi-autonomous or autonomous self-driving vehicle. Vehicle safety standards may require that the proper operation of any component of a vehicle safety system (including the image sensor) be verified before, during, and/or after operation of the vehicle. Verification operations for the image sensor may be performed by the imaging system prior to and/or after operation of a vehicle (e.g., upon startup and/or shutdown of the imaging system). System 100 may also be a security system or any other desired type of system.

Figure 2:
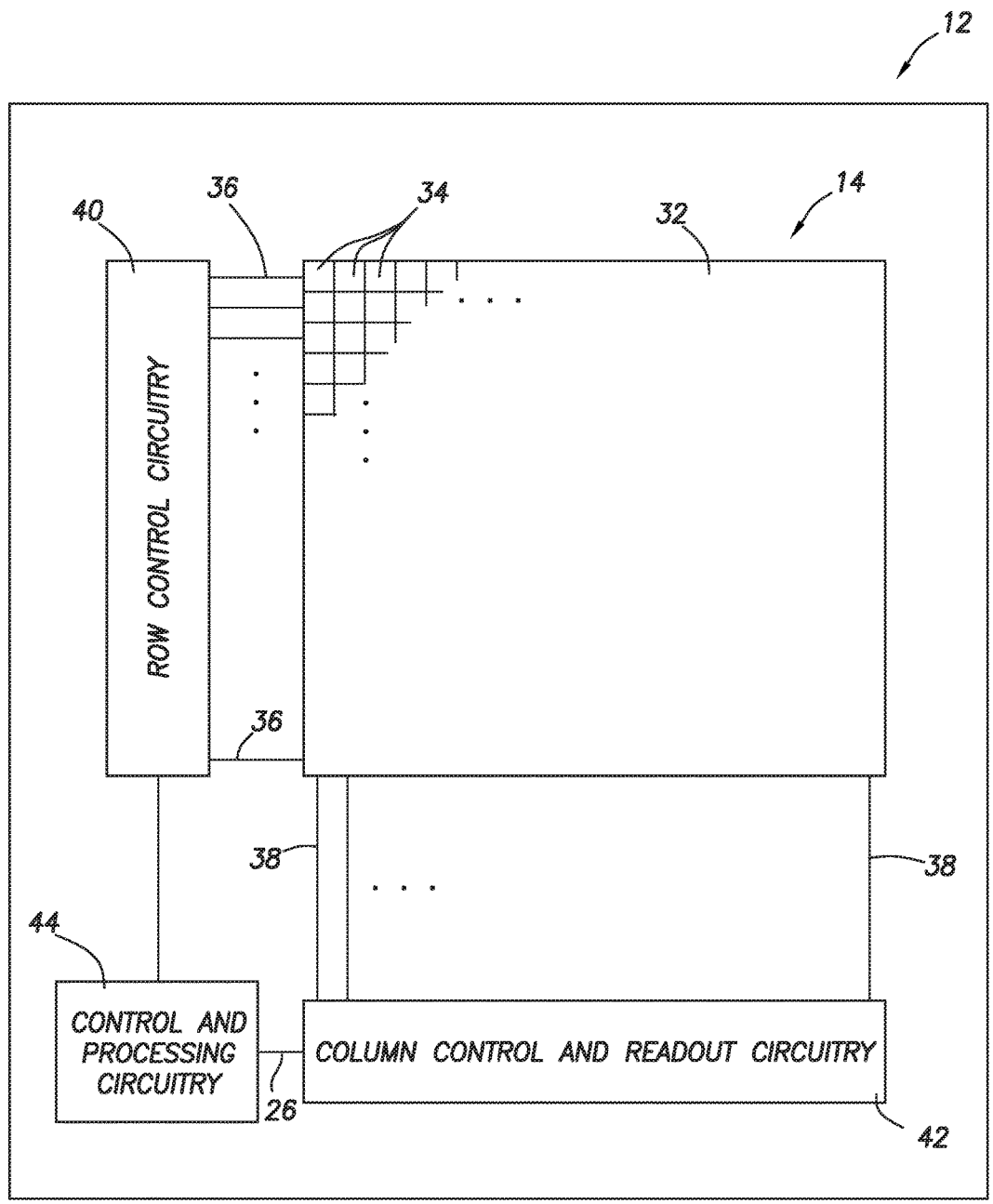
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34). Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

Figure 3:
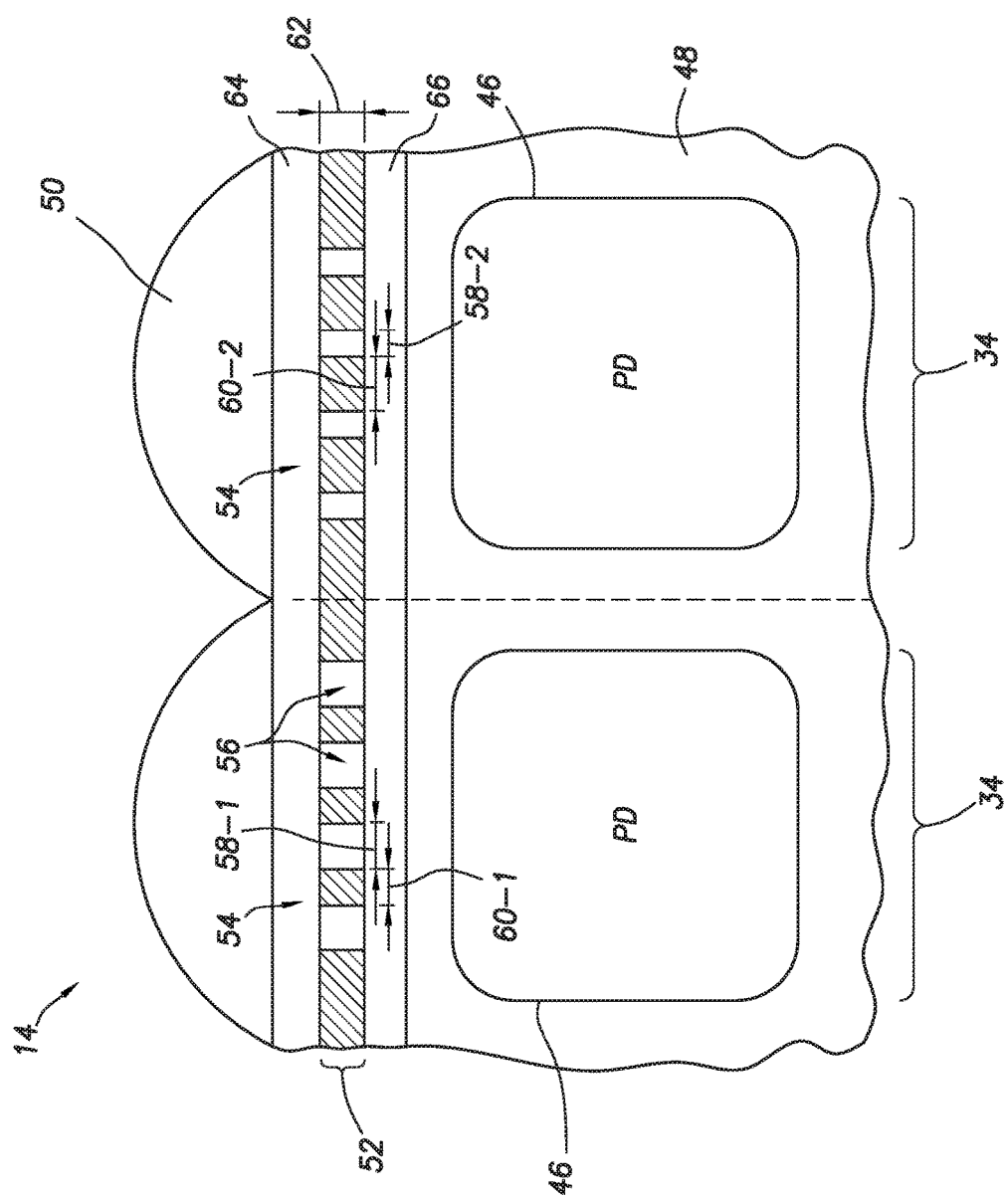
FIG. 3 is a cross-sectional side view of an illustrative image sensor having plasmonic color filter elements in accordance with an embodiment.

FIG. 3 is an illustrative cross-sectional view of pixels 34 in image sensor 14. Two representative pixels 34 are shown in FIG. 3. Each pixel may include a respective photosensitive region 46 formed in a substrate such as silicon substrate 48. The photosensitive regions may be formed by p-type or n-type doped silicon, for example. As shown in FIG. 3, each pixel may include a respective photodiode (PD). Microlenses 50 may be formed over photodiodes 46 and may be used to direct incident light towards the photodiodes. Photosensitive regions 46 may serve to absorb incident light focused by microlenses 50 and produce pixel signals that correspond to the amount of incident light absorbed.

A color filter layer 52 that includes color filter elements such as color filter elements 54 (sometimes referred to as color filters, plasmonic color filters, plasmonic color filter elements, plasmonic optical elements, surface plasmon optical filters, surface plasmonic resonance filters, etc.) may be interposed between microlenses 50 and substrate 48. Color filter layer 52 may be formed from a metal layer having a plurality of openings 56. The example in FIG. 3 of a single metal layer forming color filter layer 52 is merely illustrative. If desired, the color filter layer may include two or more metal layers with intervening dielectric layers. Openings 56 extend entirely through metal layer 52 (e.g., from an upper surface of the metal layer to a bottom surface of the metal layer). The arrangement and size of openings 56 in the metal layer may be selected to form plasmonic color filter elements 54. When exposed to incident light, surface plasmon resonance will occur on the plasmonic color filter elements and generate surface plasmon polaritons (SPPs). Consequently, the plasmonic color filter elements will allow transmission of a specific wavelength of light (based on the arrangement and size of openings 56) through the filter element. Openings 56 may be circular, square, non-square rectangular, or any other desired shape. Openings 56 may be elongated slits that are elongated along a longitudinal axis, as an additional example.

As shown in FIG. 3, openings 56 may have widths 58. A first plasmonic color filter element may have openings with a width 58-1 whereas a second plasmonic color filter element may have openings with a width 58-2 that is smaller than 58-1. The openings may be separated by distance 60. The first plasmonic color filter element may have openings separated by a distance 60-1 whereas the second plasmonic color filter element may have openings separated by a distance 60-2 that is greater than distance 60-1. Distances 58-1 and 60-1 may be selected such that light of a first wavelength (e.g., red light) is transmitted through the color filter element towards the photodiode. Distances 58-2 and 60-2 may be selected such that light of a second wavelength that is different than the first wavelength (e.g., blue light) is transmitted through the color filter element towards the photodiode. In other words, openings 56 determine the transmission profile of light through the color filter elements. The color filter elements may transmit a narrow range of wavelengths.

The distances 58 that define the widths of the openings in the color filter element layer may be any desired distances. For example, each opening width 58 may be between 10 nanometers and 300 nanometers, between 100 nanometers and 300 nanometers, between 10 nanometers and 5 microns, between 10 nanometers and 3 microns, greater than 10 nanometers, greater than 1 nanometer, greater than 100 nanometers, greater than 1 micron, greater than 5 microns, less than 5 microns, less than 10 microns, less than 3 microns, less than 1 micron, less than 300 nanometers, less than 10 nanometers etc. Similarly, each distance 60 between openings may be between 10 nanometers and 300 nanometers, between 100 nanometers and 300 nanometers, between 10 nanometers and 5 microns, between 10 nanometers and 3 microns, greater than 10 nanometers, greater than 1 nanometer, greater than 100 nanometers, greater than 1 micron, greater than 5 microns, less than 5 microns, less than 10 microns, less than 3 microns, less than 1 micron, less than 300 nanometers, less than 10 nanometers etc. The openings may be have a width that is sufficiently small to block light from passing through the openings directly (and only allow surface plasmon polaritons to pass through the filter). This example, however, is merely illustrative. If desired, some of the openings may have a width that allows light to pass directly through the opening.

Color filter layer 52 may be formed from a metal that exhibits surface plasmon resonance effects. For example, color filter element layer 52 may be formed from a metal (e.g., a noble metal) such as gold, silver, platinum, aluminum, copper, or a combination of one or more of these materials. The metal that forms color filter element 52 may have a negative dielectric constant. Color filter layer 52 may have a height 62. Height 62 may be between 10 nanometers and 300 nanometers, between 100 nanometers and 300 nanometers, between 10 nanometers and 5 microns, between 10 nanometers and 3 microns, greater than 10 nanometers, greater than 1 nanometer, greater than 100 nanometers, greater than 1 micron, greater than 5 microns, less than 5 microns, less than 10 microns, less than 3 microns, less than 1 micron, less than 300 nanometers, less than 10 nanometers etc.

FIG. 3 shows optional dielectric materials formed on either side of color filter layer 52. As shown in FIG. 3, a first dielectric layer 64 is interposed between the upper surface of color filter layer 52 and the lower surfaces of microlenses 50. A second dielectric layer 66 is interposed between the lower surface of color filter layer 52 and the upper surface of substrate 48. Dielectric layers 64 and 66 may be formed from air or any other desired dielectric material (e.g., polymer, silicon dioxide, etc.). Similarly, openings 56 in metal layer 52 may be filled air or any other desired dielectric material. Dielectric layers 64 and 66 may be omitted if desired. For example, microlenses 50 may be formed directly on the upper surface of metal layer 52. Similarly, the lower surface of metal layer 52 may be formed directly on substrate 48.

The image sensor shown in FIG. 3 may suffer from cross-talk between adjacent pixels. Surface plasmon polaritons may propagate across the upper surface of metal layer 52 and reach the color filter elements of adjacent pixels. To prevent cross-talk without sacrificing fill factor, metal walls may be included in between adjacent plasmonic color filter elements.

Figures 4A, 4B, 4C:
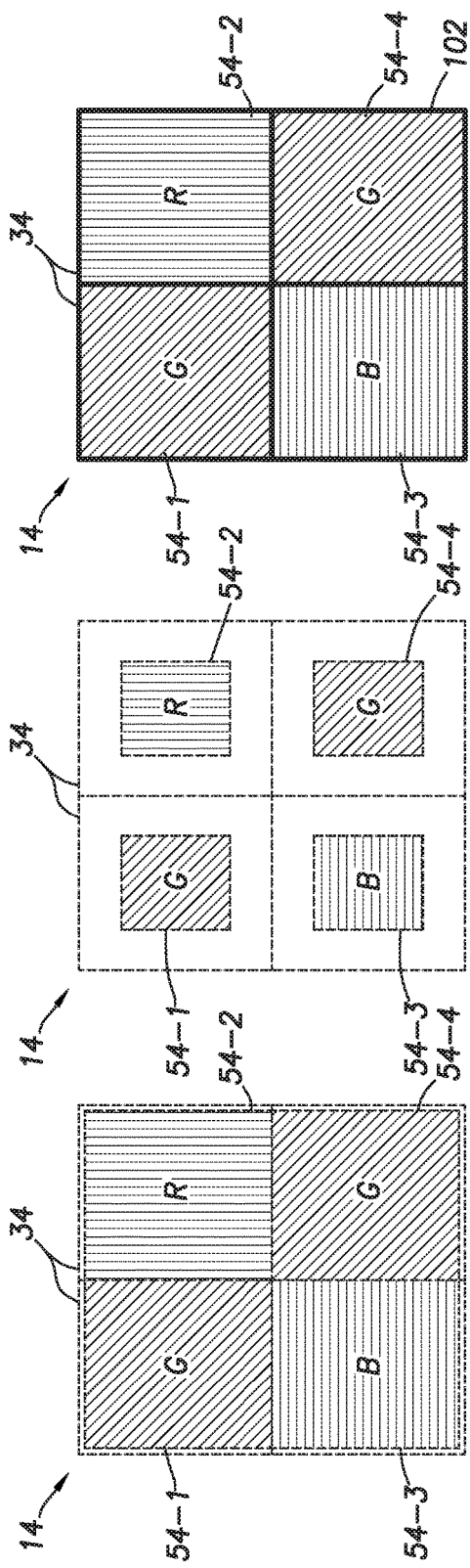
FIG. 4A is a top view of an illustrative image sensor having plasmonic color filter elements of the type shown in FIG. 3 in accordance with an embodiment.
FIG. 4B is a top view of an illustrative image sensor having plasmonic color filter elements and a reduced fill factor to reduce cross-talk in accordance with an embodiment.
FIG. 4C is a top view of an illustrative image sensor having plasmonic color filter elements and metal walls to reduce cross-talk in accordance with an embodiment.
Figure 5C:
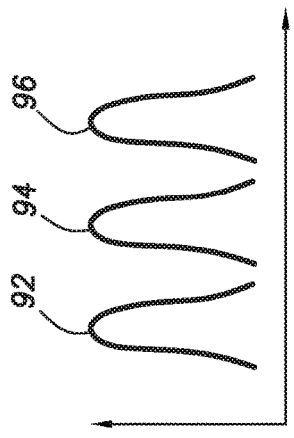
FIG. 5C is a graph showing the response of pixels having the blue, green, and red color filter elements of the image sensor in FIG. 4C in accordance with an embodiment.
Figure 5B:
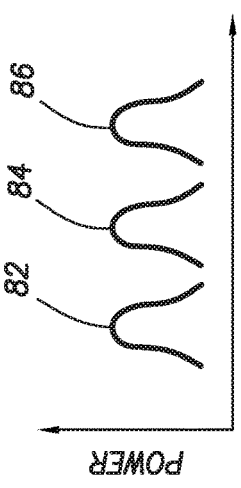
FIG. 5B is a graph showing the response of pixels having the blue, green, and red color filter elements of the image sensor in FIG. 4B in accordance with an embodiment.
Figure 5A:
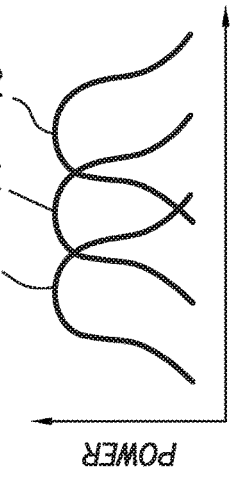
FIG. 5A is a graph showing the response of pixels having the blue, green, and red color filter elements of the image sensor in FIG. 4A in accordance with an embodiment.

FIGS. 4A-4C show top views of illustrative image sensors having plasmonic color filter elements. FIGS. 5A-5C are corresponding graphs showing power as a function of wavelength for the image sensors of FIGS. 4A-4C. FIG. 4A shows an image sensor having plasmonic color filter elements of the type shown in FIG. 3. As shown in FIG. 4A, each pixel may be covered by a respective color filter element. The color filter elements are arranged in a 2×2 unit square that is repeated across the image sensor. Plasmonic color filter element 54-1 is formed in the upper-left of the unit square, plasmonic color filter element 54-2 is formed in the upper-right of the unit square, plasmonic color filter element 54-3 is formed in the lower-left of the unit square, and plasmonic color filter element 54-4 is formed in the lower-right of the unit square. In the example of FIG. 4A, color filter element 54-1 transmits green light, color filter element 54-2 transmits red light, color filter element 54-3 transmits blue light, and color filter element 54-4 transmits green light. This arrangement is sometimes referred to as a Bayer color filter pattern. This example is merely illustrative, and any desired color filter pattern may be used.

FIG. 5A is a graph showing power as a function of wavelength for the image sensor of FIG. 4A. Curve 72 shows the response of the pixel having the blue color filter element (e.g., color filter element 54-3 in FIG. 4A) to incident light, curve 74 shows the response of the pixel having the green color filter element (e.g., color filter element 54-1 in FIG. 4A) to incident light, and curve 76 shows the response of the pixel having the red color filter element (e.g., color filter element 54-2 in FIG. 4A) to incident light. As shown, due to cross-talk caused by propagation of surface plasmon polaritons to adjacent pixels, there is significant overlap between the curves. It is therefore difficult to distinguish between blue and green light and between green and red light using the pixels of FIG. 4A.

FIG. 4B shows an image sensor with reduced cross-talk compared to the image sensor of FIG. 4A. To reduce cross-talk, the separation between the color filter elements (and underlying photosensitive areas) is increased (as shown in FIG. 4B). This is referred to as lowering the fill factor (e.g., the ratio of a pixel's light sensitive area to its total area) of the pixels. FIG. 5B is a graph showing power as a function of wavelength for the image sensor of FIG. 4B. Curve 82 shows the response of the pixel having the blue color filter element (e.g., color filter element 54-3 in FIG. 4B) to incident light, curve 84 shows the response of the pixel having the green color filter element (e.g., color filter element 54-1 in FIG. 4B) to incident light, and curve 86 shows the response of the pixel having the red color filter element (e.g., color filter element 54-2 in FIG. 4B) to incident light. As shown, lowering the fill factor reduces the cross-talk caused by propagation of surface plasmon polaritons to adjacent pixels. However, the dynamic range (and quantum efficiency) of the image sensor is sacrificed in the sensor of FIG. 4B (because there is a lower response from the pixels for the same amount of light compared to the image sensor of FIG. 4A). As shown in FIG. 5B, the maximum powers of curves 82, 84, and 86 are less than the maximum powers of curves 72, 74, and 76.

FIG. 4C shows an image sensor with reduced cross-talk compared to the image sensor of FIG. 4A without sacrificing fill factor as in the image sensor of FIG. 4B. To reduce cross-talk, metal walls 102 (sometimes referred to as metal structures 102, metal sidewalls 102, or reflective walls 102) are formed between each adjacent color filter element. The metal walls may be considered a part of the underlying color filter elements or may be considered a separate structure from the underlying color filter elements. The metal walls are formed in a grid across the entire image sensor, for example. In this embodiment, each pixel has a metal wall formed around the periphery of the pixel. FIG. 5C is a graph showing power as a function of wavelength for the image sensor of FIG. 4C. Curve 92 shows the response of the pixel having the blue color filter element (e.g., color filter element 54-3 in FIG. 4C) to incident light, curve 94 shows the response of the pixel having the green color filter element (e.g., color filter element 54-1 in FIG. 4C) to incident light, and curve 96 shows the response of the pixel having the red color filter element (e.g., color filter element 54-2 in FIG. 4C) to incident light. As shown, adding the metal walls reduces the cross-talk caused by propagation of surface plasmon polaritons to adjacent pixels. Additionally, the dynamic range (and quantum efficiency) of the image sensor is not sacrificed as in the sensor of FIG. 4B (because the fill factor is maintained at a similar level as in the sensor of FIG. 4A). As shown in FIG. 5C, the maximum powers of curves 92, 94, and 96 are equal to or greater than the maximum powers of curves 72, 74, and 76.

Figure 6:
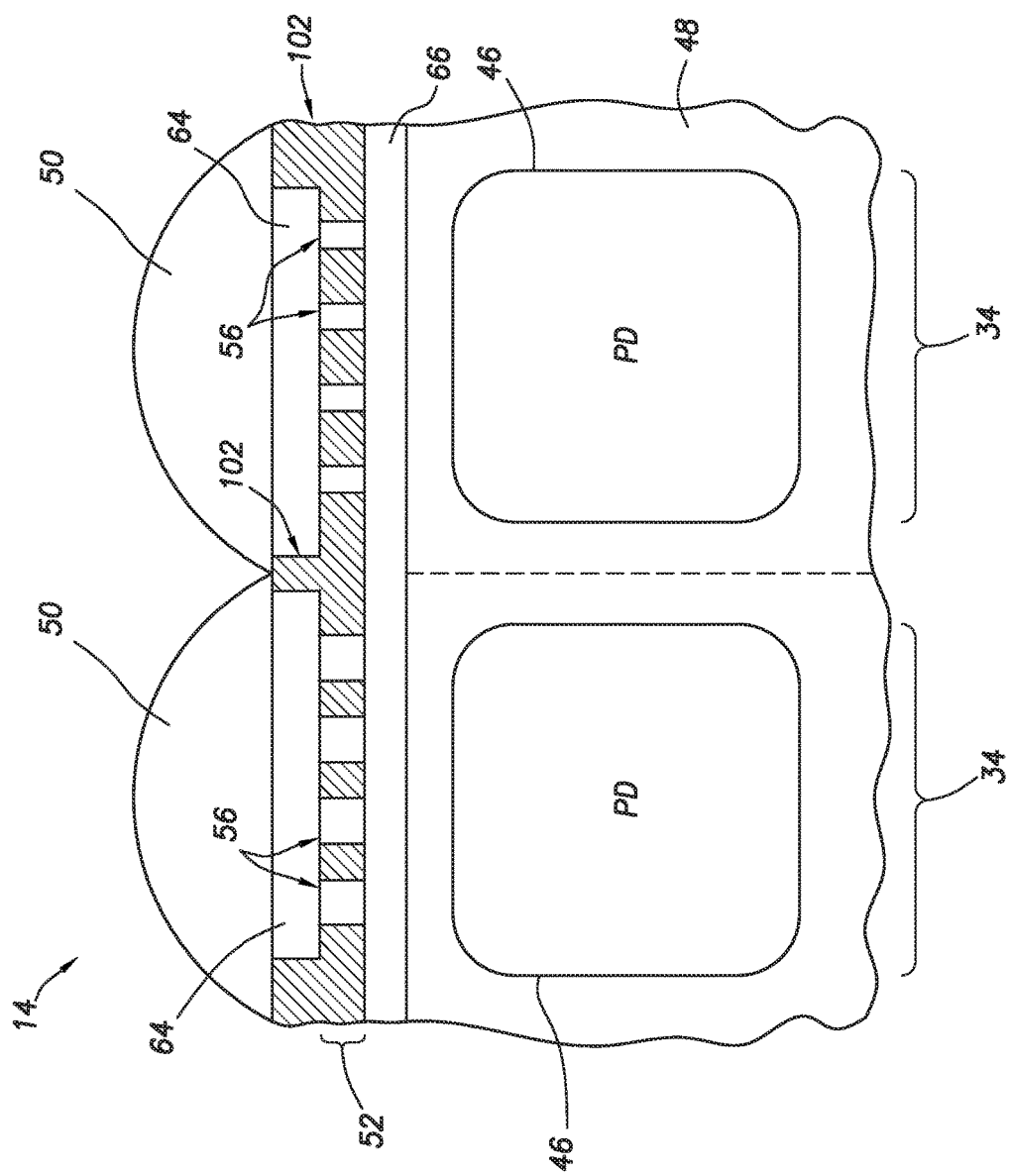
FIG. 6 is a cross-sectional side view of an illustrative image sensor that has plasmonic color filter elements and metal walls such as the image sensor shown in FIG. 4C in accordance with an embodiment.

FIG. 6 is a cross-sectional side view of an image sensor with plasmonic color filter elements separated by metal walls (similar to as shown in FIG. 4C, for example). The image sensor in FIG. 6 has similar features as the image sensor in FIG. 3. For example, photosensitive regions 46 are formed in substrate 48. Metal color filter layer 52 with openings 56 that forms plasmonic color filter elements is formed over the photosensitive regions. Dielectric layer 66 may optionally be interposed between the color filter layer and the substrate.

In FIG. 6, however, metal walls 102 are formed in between adjacent pixels 34. Metal walls 102 may be formed over the upper surface of color filter layer 52 with openings 56. In one possible embodiment, metal walls 102 may be formed in the same processing step as metal layer 52 and may be formed integrally with metal layer 52 (e.g., a single metal layer may be patterned to form openings 56 for the color filter elements and metal walls 102 for cross-talk reduction). In another embodiment, metal walls 102 may be formed in a different processing step than metal layer 52 (e.g., a separate metal layer of the same or a different material than metal layer 52 may be formed on the upper surface of metal layer 52 to form metal walls 102). Metal walls 102 may be formed using semiconductor processing techniques. For example, a metal layer may be deposited over layer 52 and etched (or lift off) to form the metal walls.

Metal walls 102 may block surface plasmon polaritons from a given color filter element from passing to an adjacent color filter element (by reflecting the surface plasmon polaritons). Metal walls 102 may also enhance the resonance effect and increase transmission of plasmonic color filters 54 (by reflecting the surface plasmon polaritons and keeping them within the color filter element). This may also reduce the number of periodic structures required (e.g., less openings 56 will be required) to form the plasmonic color filter element.

Metal walls 102 may have any desired height (e.g., the distance between the upper surface of the metal wall and the upper surface of metal layer 52). The height of the metal walls may be between 10 nanometers and 300 nanometers, between 100 nanometers and 300 nanometers, between 10 nanometers and 5 microns, between 10 nanometers and 3 microns, greater than 10 nanometers, greater than 1 nanometer, greater than 100 nanometers, greater than 1 micron, greater than 5 microns, less than 5 microns, less than 10 microns, less than 3 microns, less than 1 micron, less than 300 nanometers, less than 10 nanometers etc. Metal walls 102 may have any desired thickness. The thickness of the metal walls may be between 10 nanometers and 300 nanometers, between 100 nanometers and 300 nanometers, between 10 nanometers and 5 microns, between 10 nanometers and 3 microns, greater than 10 nanometers, greater than 1 nanometer, greater than 100 nanometers, greater than 1 micron, greater than 5 microns, less than 5 microns, less than 10 microns, less than 3 microns, less than 1 micron, less than 300 nanometers, less than 10 nanometers etc.

Dielectric material 64 may be formed between metal walls 102, as shown in FIG. 6. Dielectric material 64 may have a low refractive index. Dielectric material 64 may be formed from air. In FIG. 6, the upper surfaces of metal walls 102 are in direct contact with the lower surfaces of microlenses 50. This example is merely illustrative. If desired, an additional dielectric layer may be interposed between the upper surfaces of metal walls 102 and the lower surfaces of microlenses 50.

Figure 7:
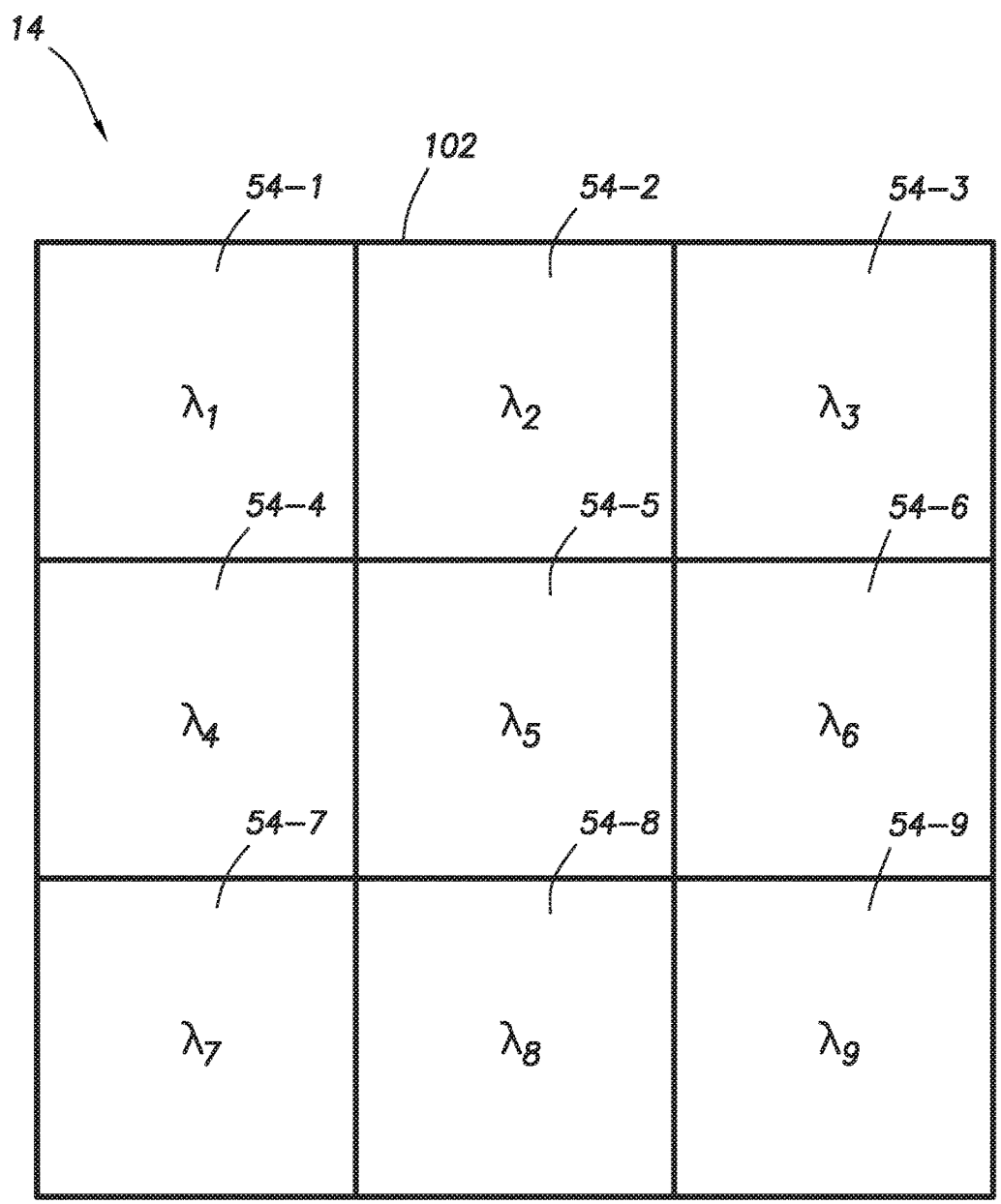
FIG. 7 is a top view of an illustrative image sensor having nine plasmonic color filter elements in a 3×3 unit square and metal walls in accordance with an embodiment.

One of the advantages of the plasmonic color filter elements shown in FIG. 6 is the flexibility to form different types of color filter elements with minimal variation to manufacturing processes. Color filter elements for transmitting light of a wide variety of wavelengths (e.g., between 200 nanometers and 2 microns) may be formed using a single metal layer 52. This helps mitigate manufacturing time and costs. Image sensors with two or more color filter types may sometimes be referred to as multi-spectral image sensors. FIG. 7 is a top view of an illustrative multi-spectral image sensor having a color filter pattern with a 3×3 unit square that is repeated across the image sensor. As shown in FIG. 7, color filter elements 54-1, 54-2, 54-3, 54-4, 54-5, 54-5, 54-6, 54-7, 54-8, and 54-9 are arranged in a 3×3 square. Each color filter element is surrounded by metal walls 102. Each color filter element transmits a respective wavelength of light. Color filter element 54-1 transmits light at a first wavelength ($\lambda_1$), color filter element 54-2 transmits light at a second wavelength ($\lambda_2$), color filter element 54-3 transmits light at a third wavelength ($\lambda_3$), color filter element 54-4 transmits light at a fourth wavelength ($\lambda_4$), color filter element 54-5 transmits light at a fifth wavelength ($\lambda_5$), color filter element 54-6 transmits light at a sixth wavelength ($\lambda_6$), color filter element 54-7 transmits light at a seventh wavelength ($\lambda_7$), color filter element 54-8 transmits light at a eighth wavelength ($\lambda_8$), and color filter element 54-9 transmits light at a ninth wavelength ($\lambda_9$). The nine wavelengths of FIG. 7 may all be different (e.g., due to different opening sizes and arrangements in the respective color filter elements).

The arrangement of FIG. 7 is merely illustrative. In general, an image sensor may include plasmonic color filter elements. The plasmonic color filter elements may have walls around their peripheries to prevent cross-talk. An image sensor with plasmonic color filter elements of this type may include any desired number of different types of color filter elements. For example, the image sensor may be a monochrome image sensor (with plasmonic color filter elements that all transmit light of the same wavelength). The image sensor may be a multi-spectral image sensor with two or more types of plasmonic color filter elements that transmit light of two or more respective wavelengths. For example, the image sensor may include plasmonic color filter elements arranged in a Bayer color filter pattern (with three types of color filters each transmitting a respective wavelength of light). The image sensor may include four or more different types of plasmonic color filter elements, six or more different types of plasmonic color filter elements, eight or more different types of plasmonic color filter elements, ten or more different types of plasmonic color filter elements, etc.

In various embodiment, an image sensor may include an array of imaging pixels and each imaging pixel may include a photosensitive region, a microlens formed over the photosensitive region, a plasmonic color filter element interposed between the microlens and the photosensitive region, and metal walls that extend around a periphery of the plasmonic color filter element.

The plasmonic color filter element may include a metal layer (or two or more stacked metal layers having intervening dielectric layers) having a plurality of openings. The metal layer may include a material selected from the group consisting of: gold, silver, platinum, aluminum, and copper. Each opening of the plurality of openings may have a width between 10 nanometers and 300 nanometers. The metal layer may have an upper surface and a lower surface and the metal walls may be formed over the upper surface of the metal layer. Each opening of the plurality of openings may extend from the upper surface of the metal layer to the lower surface of the metal layer. The metal walls may extend upwards from the upper surface of the metal layer towards the microlens. The image sensor may also include a material formed between the metal walls over the upper surface of the metal layer. The material may include air. The image sensor may also include a dielectric layer interposed between the plasmonic color filter element and the photosensitive region. The metal walls may include a material selected from the group consisting of: gold, silver, platinum, aluminum, and copper.

In various embodiments, an image sensor may include an array of imaging pixels and each imaging pixel may include a photosensitive region, a microlens formed over the photosensitive region, and a plasmonic color filter element interposed between the microlens and the photosensitive region. The plasmonic color filter element may have one or more metal layers (e.g., a single metal layer or stacked metal layers having dielectric layers in between) with openings and metal walls that surround the metal layer. Each opening of the plurality of openings may have a width that is less than 2 microns.

In various embodiments, a color filter element may include a metal layer with an upper surface, a lower surface, and a periphery, a plurality of openings in the metal layer (or stacked metal layers having dielectric layers in between), and metal walls that extend above the upper surface of the metal layer and that run around the periphery of the metal layer.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising an array of imaging pixels, wherein each imaging pixel comprises:
    a photosensitive region;
    a microlens formed over the photosensitive region;
    a plasmonic color filter element interposed between the microlens and the photosensitive region; and
    metal walls that extend around a periphery of the plasmonic color filter element.

2. The image sensor defined in claim 1, wherein the plasmonic color filter element comprises one or more metal layers having a plurality of openings.

3. The image sensor defined in claim 2, wherein the one or more metal layers comprise a material selected from the group consisting of: gold, silver, platinum, aluminum, and copper.

4. The image sensor defined in claim 2, wherein each opening of the plurality of openings has a width between 10 nanometers and 300 nanometers.

5. The image sensor defined in claim 1, further comprising:
    a dielectric layer interposed between the plasmonic color filter element and the photosensitive region.

6. The image sensor defined in claim 1, wherein the metal walls comprise a material selected from the group consisting of: gold, silver, platinum, aluminum, and copper.

7. An image sensor comprising an array of imaging pixels, wherein each imaging pixel comprises:
    a photosensitive region;

a microlens formed over the photosensitive region;

a plasmonic color filter element interposed between the microlens and the photosensitive region, wherein the plasmonic color filter element comprises one or more metal layers having a plurality of openings, an upper surface, and a lower surface; and metal walls that extend around a periphery of the plasmonic color filter element, wherein the metal walls are formed over the upper surface of the one or more metal layers.

8. The image sensor defined in claim 7, wherein each opening of the plurality of openings extends from the upper surface of the one or more metal layers to the lower surface of the one or more metal layers.

9. The image sensor defined in claim 7, wherein the metal walls extend upwards from the upper surface of the one or more metal layers towards the microlens.

10. The image sensor defined in claim 7, further comprising:

a material formed between the metal walls over the upper surface of the one or more metal layers.

11. The image sensor defined in claim 10, wherein the material comprises air.

12. The image sensor defined in claim 7, wherein the one or more metal layers comprise a material selected from the group consisting of: gold, silver, platinum, aluminum, and copper.

13. The image sensor defined in claim 7, wherein each opening of the plurality of openings has a width between 10 nanometers and 300 nanometers.

14. The image sensor defined in claim 7, further comprising:

a dielectric layer interposed between the plasmonic color filter element and the photosensitive region.

15. The image sensor defined in claim 7, wherein the metal walls comprise a material selected from the group consisting of: gold, silver, platinum, aluminum, and copper.

16. An image sensor comprising an array of imaging pixels, wherein at least one of the imaging pixels comprises:

a photosensitive region;

a microlens formed over the photosensitive region;

a plasmonic color filter element formed over the photosensitive region, wherein the plasmonic color filter element comprises one or more metal layers having an upper surface and a lower surface; and metal walls that extend around a periphery of the plasmonic color filter element, wherein the metal walls are formed over the upper surface of the one or more metal layers.

17. The image sensor defined in claim 16, wherein the one or more metal layers has a plurality of openings that extend from the upper surface to the lower surface.

18. The image sensor defined in claim 16, wherein the plasmonic color filter element is interposed between the microlens and the photosensitive region.

* * * * *